(12) United States Patent
Moon et al.

(10) Patent No.: US 7,989,691 B2
(45) Date of Patent: Aug. 2, 2011

(54) DYE FOR DYE-SENSITIZED SOLAR CELL AND DYE-SENSITIZED SOLAR CELL INCLUDING THE SAME

(75) Inventors: Soo-Jin Moon, Suwon-si (KR); Ji-Won Lee, Suwon-si (KR); Jae-Man Choi, Suwon-si (KR); Byong-Cheol Shin, Suwon-si (KR); Joung-Won Park, Suwon-si (KR); Jae-Jung Ko, Yeongi-gun (KR); Jae-Kwan Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 160 days.

(21) Appl. No.: 12/324,962

(22) Filed: Nov. 28, 2008

(65) Prior Publication Data

US 2009/0293951 A1    Dec. 3, 2009

(30) Foreign Application Priority Data

Nov. 28, 2007 (KR) .................. 10-2007-0122152

(51) Int. Cl.
*H01L 31/00* (2006.01)
*H01L 21/00* (2006.01)
*C07D 333/00* (2006.01)
*C07D 409/00* (2006.01)

(52) U.S. Cl. ............ 136/252; 136/256; 136/263; 549/4; 549/49; 549/60; 438/82; 438/63; 438/69

(58) Field of Classification Search .................. 136/256, 136/252, 263; 549/4, 49, 59, 60; 438/82, 438/63, 69; 548/183
See application file for complete search history.

(56) References Cited

U.S. PATENT DOCUMENTS 5,403,361 A * 4/1995 Schrell et al. .................... 8/581

FOREIGN PATENT DOCUMENTS

| EP | 0274184 | 7/1988 |
|---|---|---|
| JP | 06-065518 | 3/1994 |

OTHER PUBLICATIONS

Hara, K., et al., "Novel polyene dyes for highly efficient dye-sensitized solar cells," *Chem. Commun.*, 2003, pp. 252-253, The Royal Society of Chemistry 2003.
Hara, K., et al., "Design of new coumarin dyes having thiophene moieties for highly efficient organic-dye-sensitized solar cells," *New J. Chem*, 2003, pp. 783-785, 27, The Royal Society of Chemistry and the Centre National de la Recherche Scientifique 2003.

* cited by examiner

*Primary Examiner* — Ling-Siu Choi
*Assistant Examiner* — Monique Peets
(74) *Attorney, Agent, or Firm* — Christie, Parker & Hale, LLP

(57) ABSTRACT

A dye for a dye-sensitized solar cell according to embodiments of the present invention includes a compound having a silane group. The dye according to embodiments of the present invention may be used in a light absorption layer to improve photovoltaic efficiency and increase open-circuit voltage.

16 Claims, 2 Drawing Sheets

DYE FOR DYE-SENSITIZED SOLAR CELL AND DYE-SENSITIZED SOLAR CELL INCLUDING THE SAME

CROSS-REFERENCE TO RELATED APPLICATION

This application claims priority to and the benefit of Korean Patent Application No. 10-2007-0122152 filed in the Korean Intellectual Property Office on Nov. 28, 2007, the entire content of which is incorporated herein by reference.

BACKGROUND OF THE INVENTION

1. Field of the Invention

The present invention relates to dyes (photosensitizers) for dye-sensitized solar cells and to dye-sensitized solar cells including the same.

2. Description of the Related Art

Diverse research has been carried out in an attempt to develop energy sources that can replace conventional fossil fuels and solve the approaching energy crisis. Particularly, extensive research is underway to find ways of using alternative energy sources, such as wind power, atomic power, and solar power, as substitutes for petroleum resources, which are expected to be depleted within several decades. Among these alternative energy sources, solar cells use solar energy, which is infinite and environmentally friendly, unlike other energy sources. Since 1983, when Si solar cells were first produced, solar cells have been emphasized, and Si solar cells have recently drawn attention from researchers.

However, practical use of Si solar cells is difficult due to high production costs and challenges in improving cell efficiency. Accordingly, researchers are focusing on the development of dye-sensitized solar cells that can be produced at low cost.

Unlike the Si solar cell, the dye-sensitized solar cell is an electrochemical solar cell mainly composed of photosensitive dye molecules that absorb visible rays and produce electron-hole pairs, and a transition metal oxide that transfers the produced electrons. Dye-sensitized solar cells can be produced at low cost, and since they use transparent electrodes, the cells can be applied to the external glass walls of a building or glass greenhouse. However, dye-sensitized solar cells have limited practical application due to their low photoelectric efficiency.

The photoelectric efficiency of a solar cell is proportional to the quantity of electrons produced from the absorption of solar beams. Thus, to increase the photoelectric efficiency, the quantity of electrons should be increased, or the produced and excited electrons should be prevented from being used to cause electron-hole recombination. The quantity of produced electrons can be increased by raising the absorption of solar beams or the dye adsorption efficiency.

Particles of an oxide semiconductor should be nano-sized to increase the dye adsorption efficiency of each unit area. The reflectivity of a platinum electrode should be increased, or a micro-sized oxide semiconductor light scattering agent should be included to increase the absorption of solar beams. However, these conventional methods have limitations in increasing the photoelectric efficiency of solar cells.

SUMMARY OF THE INVENTION

One embodiment of the present invention provides an organic dye for a dye-sensitized solar cell having high efficiency.

Another embodiment of the present invention provides a dye-sensitized solar cell including the organic dye.

According to one embodiment of the present invention, a dye for a dye-sensitized solar cell includes a compound represented by the following Formula 1.

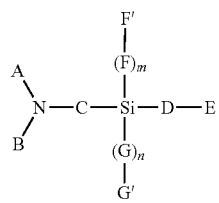

Chemical Formula 1

In Formula 1, each of A and B may be independently selected from substituted and unsubstituted aromatic hydrocarbons, substituted and unsubstituted heterocycles, and combinations thereof. Each of C and D may be independently selected from substituted and unsubstituted alkylenes, substituted and unsubstituted cycloalkylenes, substituted and unsubstituted alkenylenes, substituted and unsubstituted arylenes, substituted and unsubstituted divalent heterocycles, and combinations thereof. E may be an acidic functional group. Each of F and G may be independently selected from ethers, thioethers, substituted and unsubstituted alkylenes, substituted and unsubstituted cycloalkylenes, substituted and unsubstituted alkenylenes, substituted and unsubstituted arylenes, and substituted and unsubstituted divalent heterocycles. Each of F' and G' may be independently selected from hydrogen atoms, hydroxy groups, halogens, nitro groups, cyano groups, amino groups, acyl groups, acyloxy groups, acylamino groups, carboxyl groups, sulfonyl groups, alkyl groups, cycloalkyl groups, haloalkyl groups, alkylamino groups, alkylsulfonyl groups, aminosulfonyl groups, alkylthio groups, alkoxy groups, alkoxysulfonyl groups, alkoxycarbonyl groups, aryl groups, aryloxy groups, aryloxycarbonyl groups, alkenyl groups, alkynyl groups, aralkyl groups, and heterocyclic groups. Each of m and n is independently an integer ranging from 0 to 20.

According to another embodiment, a dye-sensitized solar cell includes a first electrode including a conductive transparent substrate, a light absorption layer on a first side of the first electrode, a second electrode facing the first electrode, and an electrolyte between the first and second electrodes. The light absorption layer includes a semiconductor particulate and the above-described dye.

The dyes according to embodiments of the present invention are applied to the light absorption layer to improve photovoltaic efficiency.

DETAILED DESCRIPTION OF THE INVENTION

Figure 1:
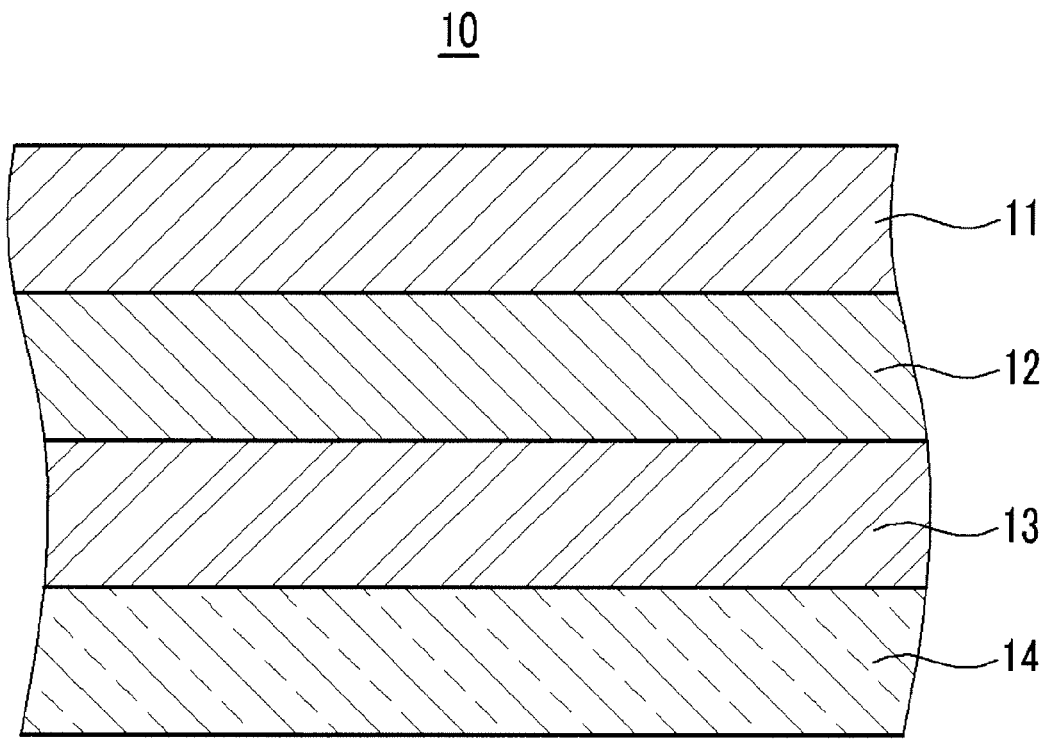
FIG. 1 is a schematic view of a dye-sensitized solar cell according to one embodiment of the present invention.

In the present specification, when specific definition is not provided, the term "alkyl" refers to a C1 to C20 alkyl, the term "cycloalkyl" refers to a C3 to C20 cycloalkyl, the term "alkoxy" refers to a C1 to C20 alkoxy, the term "aryl" refers to a C6 to C30 aryl, the term "alkenyl" refers to a C2 to C20 alkenyl, the term "alkynyl" refers to a C2 to C20 alkynyl, the term "aralkyl" refers to a C6 to C30 aralkyl, the term "alkylene" refers to a C1 to C20 alkylene, the term "cycloalkylene" refers to a substituted or unsubstituted C3 to C18 cycloalkylene, the term "alkenylene" refers to a C2 to C20 alkenylene, and the term "arylene" refers to a C6 to C30 arylene.

In the present specification, when specific definition is not provided, the term "substituted" refers to substitution with a substituent selected from halogens (e.g., F, Cl, Br, and I), hydroxy groups, nitro groups, cyano groups, amino groups, azido groups, amido groups, hydrazine groups, hydrazone groups, aldehyde groups, substituted and unsubstituted esters, carbamyl groups, substituted and unsubstituted $C_1$-$C_{20}$ alkoxy groups, substituted and unsubstituted carboxyl groups and salts thereof, substituted and unsubstituted sulfonic acid groups and salts thereof, substituted and unsubstituted phosphoric acid groups and salts thereof, substituted and unsubstituted $C_1$-$C_{15}$ alkyl groups (such as methyl groups, ethyl groups, propyl groups, isopropyl groups, isobutyl groups, etc.), substituted and unsubstituted $C_2$-$C_{16}$ alkenyl groups (such as vinyl groups, propenyl groups, butenyl groups, etc.), substituted and unsubstituted $C_2$-$C_{16}$ alkynyl groups (such as ethynyl groups), substituted and unsubstituted $C_6$-$C_{18}$ aryl groups (such as phenyl groups, naphthyl groups, tetrahydronaphthyl groups, indan groups, cyclopentadienyl groups, biphenyl groups, etc.), substituted and unsubstituted $C_7$-$C_{18}$ arylalkyl groups (such as benzyl groups, phenylethyl groups, etc.), substituted and unsubstituted $C_1$-$C_{20}$ heteroalkyl groups (i.e., alkyl groups including a hetroatom such as nitrogen, sulfur, oxygen, or phosphorus), substituted and unsubstituted $C_1$-$C_{20}$ heterocyclic groups including 1, 2, or 3 heteroatoms selected from nitrogen, sulfur, oxygen, or phosphorus, substituted and unsubstituted $C_1$-$C_{20}$ heteroaralkyl groups, substituted and unsubstituted $C_3$-$C_{15}$ cycloalkyl groups, substituted or unsubstituted $C_3$-$C_{15}$ cycloalkenyl groups, substituted and unsubstituted $C_6$-$C_{15}$ cycloalkynyl groups, and substituted and unsubstituted $C_1$-$C_{20}$ heterocycloalkyl groups.

During driving of a dye-sensitized solar cell, photocharges are generated by optical energy. In general, the photocharges are generated by the dye materials. The dye materials are excited by the absorption of light transmitted through a conductive transparent substrate.

Traditionally, the dye materials have included metal composites such as mono, bis, or tris(substituted 2,2'-bipyridine) complex salts of ruthenium. However, these metal composites have low efficiency since the electrons excited by light are quickly restored to the ground state. To address this concern, research has been conducted into metal composites covalently bonded to various electron transferring materials. However, linking the electron transferring material using covalent bonds involves complicated processes.

In one embodiment of the present invention, photoelectric efficiency of a dye-sensitized solar cell can be improved by using a compound including a silane group as the dye. The dye may be a compound represented by the following Formula 1.

Chemical Formula 1

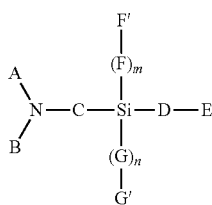

In Formula 1, each of A and B may be independently selected from substituted and unsubstituted aromatic hydrocarbons, substituted and unsubstituted heterocycles, and combinations thereof. Each of C and D may be independently selected from substituted and unsubstituted alkylenes, substituted and unsubstituted cycloalkylenes, substituted and unsubstituted alkenylenes, substituted and unsubstituted arylenes, substituted and unsubstituted divalent heterocycles, and combinations thereof. E may be an acidic functional group. Each of F and G may be independently selected from ethers, thioethers, substituted and unsubstituted alkylenes, substituted and unsubstituted cycloalkylenes, substituted and unsubstituted alkenylenes, substituted and unsubstituted arylenes, and substituted and unsubstituted divalent heterocycles. Each of F' and G' may be independently selected from hydrogen atoms, hydroxy groups, halogens, nitro groups, cyano groups, amino groups, acyl groups, acyloxy groups, acylamino groups, carboxyl groups, sulfonyl groups, alkyl groups, cycloalkyl groups, haloalkyl groups, alkylamino groups, alkylsulfonyl groups, aminosulfonyl groups, alkylthio groups, alkoxy groups, alkoxysulfonyl groups, alkoxycarbonyl groups, aryl groups, aryloxy groups, aryloxycarbonyl groups, alkenyl groups, alkynyl groups, aralkyl groups, and heterocyclic groups. Each of m and n is independently an integer ranging from 0 to 20.

In one embodiment, in the compound of Formula 1, each of A and B is independently selected from substituted and unsubstituted C6 to C20 aromatic hydrocarbons, substituted and unsubstituted heterocycles, and combinations thereof. Nonlimiting examples of suitable aromatic hydrocarbons include phenyl groups, naphthyl groups, xylyl groups, anthryl groups, phenanthryl groups, naphthacenyl groups, pyrenyl groups, biphenylyl groups, terphenylyl groups, tolyl groups, fluorenyl groups, indenyl groups, perylenyl groups, etc.

The heterocycle may be selected from substituted and unsubstituted heterocycles, substituted and unsubstituted heterocycloalkyl groups, and combinations thereof. The heterocycle may include from 4 to 23 atoms, in which 1, 2, or 3 of the atoms are heteroatoms selected from N, O, P, and S, and the remaining atoms may be carbon. The heterocycle may also be a cyclic aromatic radical in which the heteroatoms, during ring formation, oxidize or quaternize to form, for example, N-oxides or quaternary salts. Nonlimiting examples of suitable heterocycles include thienyl groups, puryl groups, benzothienyl groups, pyridyl groups, pyrazinyl groups, pyrimidinyl groups, pyridazinyl groups, quinolinyl groups, quinoxalinyl groups, imidazolyl groups, puranyl groups, benzopuranyl groups, thiazolyl groups, isoxazolyl groups, benzisoxazolyl groups, benzimidazolyl groups, triazolyl groups, pyrazolyl groups, pyrrolyl groups, indolyl groups, pyridonyl groups, N-alkyl-2-pyridonyl groups, pyrazinonyl groups, pyridazinonyl groups, pyrimidinonyl groups, oxazolonyl groups, N-oxides thereof (e.g., pyridyl N-oxide groups and quinolinyl N-oxide groups), and quaternary salts thereof.

The heterocycloalkyl groups may include from 4 to 23 atoms, of which 1, 2, or 3 may be heteroatoms selected from N, O, P, and S, and the remaining atoms may be carbon. Hydrogen atoms in the cycloalkyl groups may be substituted with an alkyl group including a heteroatom. Nonlimiting examples of suitable cycloalkyl groups include aziridinyl groups, pyrrolidinyl groups, piperidinyl groups, piperazinyl groups, morpholinyl groups, thiomorpholinyl groups, tetrahydrofuranyl groups, tetrahydrothiofuranyl groups, tetrahydropyranyl groups, pyranyl groups, etc.

Nonlimiting examples of suitable heterocycles include thiazolyl groups, benzothiazolyl groups, naphthothiazolyl groups, benzoxazolyl groups, naphthoxazolyl groups, imidazolyl groups, benzimidazolyl groups, naphthimidazolyl groups, thiazolyl groups, pyrrolyl groups, pyrazinyl groups, pyridyl groups, indolyl groups, isoindolyl groups, furyl groups, benzofuryl groups, isobenzofuryl groups, quinolyl groups, isoquinolyl groups, quinoxalinyl groups, carbazolyl groups, phenanthridinyl groups, acridinyl groups, phenanthrolinyl groups, phenazinyl groups, phenothiazinyl groups, phenoxazinyl groups, oxazolyl groups, oxadiazolyl groups, furazanyl groups, thienyl groups, etc.

In one embodiment, in Formula 1, each of C and D is independently selected from substituted and unsubstituted C2 to C20 alkylenes, substituted and unsubstituted C3 to C18 cycloalkylenes, substituted and unsubstituted C2 to C20 alkenylenes, substituted and unsubstituted C6 to C30 arylenes, and substituted and unsubstituted divalent heterocycles which include an element selected from oxygen, sulfur, nitrogen, and combinations thereof.

Each of C and D may be selected from cyclopropylene groups, cyclopentylene groups, cyclohexylene groups, 2-butenylene groups, p-phenylene groups, naphthylene groups, 2,3-tetrazol-diyl groups, 1,3-triazoyl-diyl groups, 1,5-benzimidazole-diyl groups, 2,5-benzothiazole-diyl groups, 2,5-pyridine-diyl groups, 3-phenyl-2,5-tetrazol-diyl groups, 2,5-pyridine-diyl groups, 2,4-furan-diyl groups, 1,3-piperidine-diyl groups, 2,4-morpholine-diyl groups, 1,2-thiophene-diyl groups, 1,4-thiophene-diyl groups, etc.

Each of A, B, C, and D may independently include hydrogen or a substituent selected from hydroxy groups, halogens, nitro groups, cyano groups, amino groups, acyl groups, acyloxy groups, acylamino groups, carboxyl groups, sulfonyl groups, alkyl groups, cycloalkyl groups, haloalkyl groups, alkylamino groups, alkylsulfonyl groups, alkylthio groups, aminosulfonyl groups, alkoxy groups, alkoxysulfonyl groups, alkoxycarbonyl groups, aryl groups, aryloxy groups, aryloxycarbonyl groups, alkenyl groups, alkynyl groups, aralkyl groups, and heterocyclic groups.

Considering the above substituents, the amino group may be a functional group represented by —$NX_1X_2$, where each of $X_1$ and $X_2$ is selected from hydrogen and substituents selected from hydroxy groups, halogens, nitro groups, cyano groups, amino groups, acyl groups, acyloxy groups, acylamino groups, carboxyl groups, sulfonyl groups, alkyl groups, cycloalkyl groups, haloalkyl groups, alkylamino groups, alkylsulfonyl groups, alkylthio groups, aminosulfonyl groups, alkoxy groups, alkoxysulfonyl groups, alkoxycarbonyl groups, aryl groups, aryloxy groups, aryloxycarbonyl groups, alkenyl groups, alkynyl groups, aralkyl groups, and heterocyclic groups.

Nonlimiting examples of suitable amino groups include N-methylamino groups, N-ethylamino groups, N,N-diethylamino groups, N,N-diisopropylamino groups, N,N-dibutylamino groups, N-benzylamino groups, N,N-dibenzylamino groups, N-phenylamino groups, N-phenyl-N-methylamino groups, N,N-diphenylamino groups, N,N-bis(m-tolyl)amino groups, N,N-bis(p-tolyl)amino groups, N,N-bis(p-phenylyl) amino groups, bis[4-(4-methyl)biphenyl]amino groups, N-N-biphenyl-N-phenylamino groups, N-α-naphthyl-N-phenylamino groups, N-β-naphthyl-N-phenylamino groups, N-phenanthryl-N-phenylamino groups, acetylamino groups, etc.

The acyl groups may be a functional group represented by —OCR, where R is an alkyl as defined below. Nonlimiting examples of suitable acyl groups include acetyl groups, phenoxycarbonyl groups, methoxycarbonyl groups, etc.

The acyloxy group may be a functional group represented by —OCOR, where R is an alkyl as defined below. Nonlimiting examples of the acyloxy groups include acetyloxy groups, benzoyloxy groups, octadecanoyloxy groups, cyclohexylcarbonyloxy groups, phenylcarbamoyloxy groups, etc.

The alkyl groups may be a C1 to C20 substituted or unsubstituted alkyl group. In one embodiment, the alkyl group may be a C1 to C12 substituted or unsubstituted alkyl group. In another embodiment, the alkyl group may be a C1 to C6 lower alkyl group or a C1 to C3 lower alkyl group, such as methyl groups, ethyl groups, n-propyl groups, isopropyl groups, n-butyl groups, isobutyl groups, sec-butyl groups, t-butyl groups, pentyl groups, iso-amyl groups, and hexyl groups.

The cycloalkyl group may be a C3 to 20 cycloalkyl group, such as cyclopropyl groups, cyclobutyl groups, cyclopentyl groups, etc.

The haloalkyl groups may be an alkyl group including a halogen, and the alkyl groups is as defined above.

The alkylsulfonyl groups may be represented by R—$SO_2$—, where R is an alkyl as defined above. For example, the alkylsulfonyl group include a C1 to C12 substituted or unsubstituted alkyl group. Nonlimiting examples of suitable alkylsulfonyl groups include methylsulfonyl groups, octylsulfonyl groups, ethylhexyl sulfonyl groups, etc.

The alkylthio group may be represented by R—S—, where R is an alkyl as defined above. In one embodiment, the alkylthio groups may include a C1 to C12 substituted or unsubstituted alkyl group.

The alkoxy groups may be a substituted or unsubstituted C1 to C20 alkyl functional group including oxygen. In one embodiment, the alkoxy group may be a C1 to C6 lower alkoxy group, such as methoxy groups, ethoxy groups, propoxy groups, butoxy groups, t-butoxy groups, etc. The alkoxy group may be a haloalkoxy group including at least one halogen atom, such as fluorine, chlorine, or bromine. Nonlimiting examples of suitable haloalkoxy groups include C1 to C3 haloalkoxy radicals, such as fluoromethoxy groups, chloromethoxy groups, trifluoromethoxy groups, trifluoroethoxy groups, fluoroethoxy groups, and fluoropropoxy groups.

The alkoxysulfonyl group may include an alkoxy group as defined above. Nonlimiting examples of suitable alkoxysulfonyl groups include methoxysulfonyl groups, phenoxysulfonyl groups, etc.

The alkoxycarbonyl group may be represented by —$COOX_3$, where X is selected from hydrogen atoms, halogens, alkyl groups, and acyl groups.

The aryl group may be a C6 to C30 carbocyclic aromatic-based compound including at least one ring, e.g. phenyl groups, naphthyl groups, tetrahydronaphthyl groups, indan groups, and biphenyl groups. An individual aryl group can be used, or a combination of aryl groups may be used. The ring may be attached as a pendent group or fused. According to one embodiment, the aryl group may be a phenyl group. The aryl group may have from 1 to 3 substituents selected from hydroxy groups, halogens, haloalkyl groups, nitro groups, cyano groups, alkoxy groups, C1 to C6 lower alkylamino groups, and combinations thereof.

The aryloxy group may be represented by aryl-O—, and the aryl group is as defined above.

The alkenyl group may include carbon-carbon double bonds in the middle of the alkyl group or at a terminal end of the alkyl group. The alkenyl group may be a C2 to C20 alkenyl group. According to one embodiment, the alkenyl group may be selected from vinyl groups, allyl groups, 1-butenyl groups, 1,3-butadienyl groups, 1-methylvinyl groups, and styryl groups.

The alkynyl group includes carbon-carbon triple bonds in the middle of the alkyl group or at a terminal end of the alkyl group. The alkynyl group may be a C2 to C20 alkynyl group, such as an ethynyl group.

The aralkyl group may be selected from benzyl groups, 1-phenylethyl groups, 2-phenylethyl groups, phenylisopropyl groups, methylbenzyl groups, 1-α-naphthylethyl groups, aminobenzyl groups, hydroxybenzyl groups, chlorobenzyl groups, cyanobenzyl groups, and naphthylisopropyl groups.

The heterocycle is as defined above.

In the above Formula 1, E may be an acidic functional group. According to one embodiment, E may be a substituent selected from carboxyl groups, phosphorous acid groups, sulfonic acid groups, phosphinic acid groups, hydroxy groups, oxycarboxylic acid groups, acid amide groups, boric acid groups, squaric acid groups, and combinations thereof. According to one embodiment, E is a carboxyl group.

Each of F and G is independently selected from ethers, thioethers, substituted and unsubstituted C1 to C20 alkylenes, substituted and unsubstituted C3 to C18 cycloalkylenes, substituted and unsubstituted C2 to C20 alkenylenes, substituted and unsubstituted C6 to C30 arylenes, and substituted and unsubstituted divalent heterocycles including an element selected from oxygen, sulfur, and nitrogen.

Each of F' and G' is independently selected from hydrogen atoms, hydroxy groups, halogens, nitro groups, cyano groups, amino groups, acyl groups, acyloxy groups, acylamino groups, C1 to C20 alkylamino groups, aminosulfonyl groups, carboxyl groups, sulfonyl groups, C1 to C20 alkyl groups, C3 to C20 cycloalkyl groups, C1 to C20 haloalkyl groups, C1 to C20 alkylsulfonyl groups, C1 to C20 alkylthio groups, C1 to C20 alkoxy groups, C1 to C20 alkoxysulfonyl groups, C1 to C20 alkoxycarbonyl groups, C6 to C30 aryl groups, C6 to C30 aryloxy groups, C6 to C30 aryloxycarbonyl groups, C2 to C20 alkenyl groups, C2 to C20 alkynyl groups, C6 to C30 aralkyl groups, and heterocyclic groups including an element selected from oxygen, sulfur, and nitrogen.

In one embodiment, in Formula 1, each of A and B is independently selected from substituted and unsubstituted aromatic hydrocarbons, substituted and unsubstituted heterocycles, and combinations thereof, provided that at least one of A and B is fluorenyl.

C is represented by the following Formula 1-1.

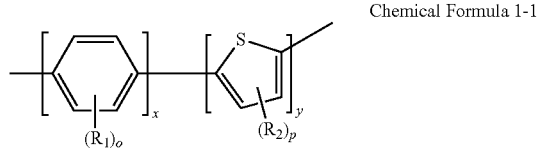

Chemical Formula 1-1

D is represented by the following Formula 1-2.

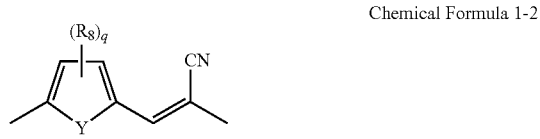

Chemical Formula 1-2

In Formulae 1-1 and 1-2, each of $R_1$, $R_2$, and $R_3$ is independently selected from hydrogen atoms, hydroxy groups, halogens, nitro groups, cyano groups, amino groups, acyl groups, acyloxy groups, acylamino groups, carboxyl groups, sulfonyl groups, alkyl groups, cycloalkyl groups, haloalkyl groups, alkylamino groups, alkylsulfonyl groups, alkylthio groups, aminosulfonyl groups, alkoxy groups, alkoxysulfonyl groups, alkoxycarbonyl groups, aryl groups, aryloxy groups, aryloxycarbonyl groups, alkenyl groups, alkynyl groups, aralkyl groups, and heterocyclic groups. Also, o is an integer ranging from 0 to 6, p is an integer ranging from 0 to 3, q is 0 or 1, and each of x and y is independently 1 or 2.

E is a carboxyl group.

Y is selected from O, S, and NR', where R' may be hydrogen or an alkyl group.

According to one embodiment, the dye may be selected from compounds represented by the following Formula 2, and mixtures thereof.

Chemical Formula 2

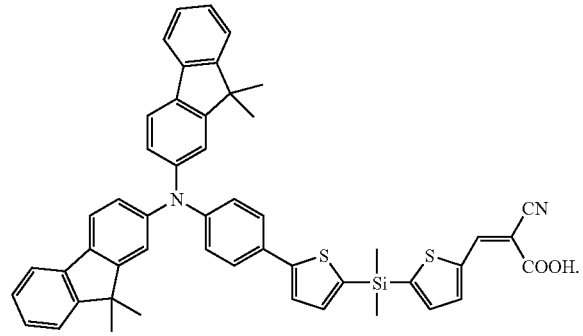

According to an embodiment of the present invention, a dye for a dye-sensitized solar cell has a structure represented by Formula 1, which includes a silane group between an aniline group and an acid group. When used in a light-absorbing layer of a dye-sensitized solar cell, the dye improves the photoelectric efficiency of the dye-sensitized solar cell.

The dye having the above structure may be prepared by first subjecting di-alkyldihalosilane to a lithiation reaction using an alkyl lithium such as butyl lithium. Then, the resulting compound is subjected to a salt elimination reaction or a Grignard reaction using magnesium to introduce a silane group. The above lithiation, salt elimination, and Grignard reactions are well-known.

According to another embodiment of the present invention, a dye-sensitized solar cell includes the dye. The dye-sensitized solar cell includes a first electrode including a conductive transparent substrate, a light absorption layer on a first side of the first electrode, a second electrode facing the first electrode where the light absorption layer is between the electrodes, and an electrolyte between the first electrode and the second electrode. The light absorption layer includes a semiconductor particulate and the above dye.

FIG. 1 is a cross-sectional view of a structure of a dye sensitized solar cell in accordance with an embodiment of the present invention. Referring to FIG. 1, the dye sensitized solar cell 10 has a sandwich-type structure in which two plate-type transparent electrodes (i.e., a first electrode 11 and a second electrode 14) face each other. A first side of the first electrode 11 includes a light absorption layer 12, which includes a semiconductor particulate and a photosensitive dye adsorbed to the semiconductor particulate. The electrons of the photosensitive dye are excited by the absorption of visible rays. The space between the two electrodes 11 and 14 is filled with an electrolyte 13 to facilitate an oxidation-reduction reaction.

When solar beams enter the dye sensitized solar cell, dye molecules in the light absorption layer 12 absorb photons. The dye molecules that have absorbed the photons are excited from the ground state (i.e., electron transfer), to thereby form electron-hole pairs. The excited electrons are injected into a conduction band on the semiconductor particulate interface.

The injected electrons are transferred to the first electrode 11 through the interface and then transferred to the second electrode 14, which faces the first electrode 11, through an external circuit. The dye is oxidized as a result of the electron transfer and reduced by ions of an oxidation-reduction couple in the electrolyte 13. The oxidized ions are involved in a reduction reaction with electrons that have arrived at the interface of the second electrode 14 to achieve charge neutrality. The dye sensitized solar cell 10 is operated as described above.

The first electrode (i.e., the working electrode or semiconductor electrode) 11 includes a transparent substrate and a conductive layer disposed on the transparent substrate. The transparent substrate may be formed of any transparent material that transmits external light, such as glass or plastic. Non-limiting examples of suitable plastics include polyethylene terephthalate (PET), polyethylene naphthalate (PEN), polycarbonate (PC), polypropylene (PP), polyimide (PI), triacetyl cellulose (TAC), copolymers thereof, and combinations thereof.

The transparent substrate may be doped with a doping material selected from Ti, In, Ga, and Al.

A conductive layer is positioned on the transparent substrate. The conductive layer may include a conductive metal oxide selected from indium tin oxide (ITO), fluorine tin oxide (FTO), ZnO—($Ga_2O_3$ or $Al_2O_3$), tin oxide, antimony tin oxide (ATO), zinc oxide, and combinations thereof. $SnO_2$ or ITO may be appropriate since they have good conductivity, transparency, and heat resistance. The conductive layer may include a single layered or multi-layered conductive metal oxide.

On the first electrode 11, a light absorption layer 12 is disposed. The light absorption layer 12 includes a semiconductor particulate and the above dye. The semiconductor particulate forms a porous light absorption layer 12, and the dye is adsorbed on a surface of the porous light absorption layer 12.

The porous light absorption layer is a fine and uniform nanoporous layer including a fine semiconductor particulate having a uniform average particle diameter.

The semiconductor particulate may be selected from elementary substances such as silicon, compound semiconductors, perovskite compounds, and mixtures thereof.

The semiconductor may be an n-type semiconductor in which electrons of the conduction band become carriers by optical excitation and provide an anode current. Nonlimiting examples of suitable compound semiconductors include oxides including at least one metal selected from Ti, Zr, Sr, Zn, In, Yr, La, V, Mo, W, Sn, Nb, Mg, Al, Y, Sc, Sm, Ga, In, and TiSr. According to one embodiment, the compound semiconductor may be selected from $TiO_2$, $SnO_2$, ZnO, $WO_3$, $Nb_2O_5$, $TiSrO_3$, and mixtures thereof. According to another embodiment, the compound semiconductor may be anatase $TiO_2$. The semiconductor is not limited to the above-mentioned materials, and the above-mentioned materials may be used individually or in combination.

The semiconductor particulate may have a large surface area to allow the dye adsorbed onto the surface of the semiconductor particulate to absorb much light. The semiconductor particulate may have an average particle diameter of about 50 nm or less. According to one embodiment, the semiconductor particulate may have an average particle diameter ranging from about 15 to about 25 nm. When the semiconductor particulate has an average particle diameter of greater than about 50 nm, a surface area of the semiconductor particulate is small, thereby deteriorating catalyst efficiency.

The porous layer can be made any method of making a porous layer. In one embodiment, for example, the porous layer can be made using a mechanical necking treatment (which does not require heat treatment), and the density of the porous layer can be controlled by adjusting the treatment conditions.

The surface of the porous layer absorbs the dye which absorbs outside light and produces excited electrons. The dye is as described above.

The light absorption layer may further include an additive for improving solar cell photovoltaic efficiency. The additive may be selected from compounds represented by the following Formula 3.

$$Z\text{-}CO_2H \quad \text{Chemical Formula 3}$$

In the above Formula 3, Z is selected from alkyl groups, cycloalkyl groups, haloalkyl groups, alkylsulfonyl groups, alkylthio groups, alkoxy groups, alkoxysulfonyl groups, alkoxycarbonyl groups, aryl groups, aryloxy groups, alkenyl groups, aralkyl groups, and heterocyclic groups.

In one embodiment, Z is selected from hydrogen atoms, hydroxy groups, halogens, nitro groups, cyano groups, amino groups, acyl groups, acyloxy groups, carboxyl groups, sulfonyl groups, C1 to C20 alkyl groups, C3 to C20 cycloalkyl groups, C1 to C20 haloalkyl groups, C1 to C20 alkylsulfonyl groups, C1 to C20 alkylthio groups, C1 to C20 alkoxy groups, C1 to C20 alkoxysulfonyl groups, C1 to C20 alkoxycarbonyl groups, C6 to C30 aryl groups, C6 to C30 aryloxy groups, C2 to C20 alkenyl groups, C6 to C30 aralkyl groups, and heterocyclic groups including an element selected from oxygen, sulfur, nitrogen, and combinations thereof.

According to one embodiment, the additive may be deoxycholic acid having the following Formula 4.

Chemical Formula 4

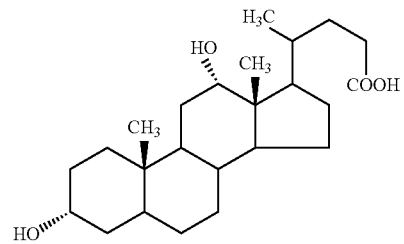

The additive may be present in an amount ranging from about 100 to about 3000 parts by weight based on 100 parts by weight of the dye. According to one embodiment, the additive is present in an amount ranging from about 100 to about 2000 parts by weight based on 100 parts by weight of the dye. When the amount of the additive is present in an amount less than about 100 parts by weight, dye aggregation may occur. When the additive is present in an amount greater than about 3000 parts by weight, the dye adsorption amount may be negligible.

Further, the light absorption layer 12 may have a thickness of about 25 µm or less. According to another embodiment, the thickness ranges from about 1 to about 25 µm. According to yet another embodiment, the thickness ranges from about 5 to about 25 µm. When the thickness of the light absorption layer 12 is greater than about 25 µm, serial resistance is increased due to the structure, and thus exchange efficiency is deteriorated. Accordingly, when the membrane thickness is maintained at about 25 µm or less, the serial resistance is lowered to prevent deterioration of the exchange efficiency.

The second electrode (counter electrode) 14 faces the first electrode 11 (including the light absorption layer 12). The second electrode 14 includes a transparent substrate and a transparent electrode facing the first electrode 11, and a catalyst electrode (not shown) is formed on the transparent substrate.

The transparent substrate may be composed of glass or plastic as in the first electrode. Nonlimiting examples of suitable plastics include polyethylene terephthalate, polyethylene naphthalate, polycarbonate, polypropylene, polyimide, triacetylcellulose, etc.

On the transparent substrate, a transparent electrode is disposed. The transparent electrode may be formed of a transparent material such as indium tin oxide, fluorine tin oxide, antimony tin oxide, zinc oxide, tin oxide, $ZnO$—$Ga_2O_3$, $ZnO$—$Al_2O_3$, etc. The transparent electrode may be mono-layered or multi-layered.

On the transparent electrode, a catalyst electrode is disposed. The catalyst electrode activates a redox couple, and includes a conductive material selected from platinum (Pt), gold (Au), ruthenium (Ru), palladium (Pd), rhodium (Rh), iridium (Ir), osmium (Os), carbon (C), $WO_3$, $TiO_2$, and conductive polymers.

Further, the catalyst electrode facing the first electrode may be porous to increase the surface area, thereby improving the catalyst effect. For example, Pt or Au may have a black state, and carbon may have a porous state. As used herein, "black state" is a state in which nothing is supported on the supporting body. Particularly, the platinum black state may be obtained by anodic oxidation methods, chloroplatinic acid methods, etc. Further, porous carbon may be obtained by sintering carbon particulate or firing organic polymers.

The second electrode 14 includes a through-hole (not shown) penetrating the second electrode. The through-hole serves to drain extra electrolyte 13 from the solar cell. Thereby, it is possible to fill the electrolyte in the cell without generating pockets inside the solar cell by draining the extra electrolyte through the hole.

The electrolyte 13 is formed of an electrolyte solution. The electrolyte solution is an iodide/triodide pair that receives and transfers electrons from the counter electrode to the dye through an oxidation-reduction reaction. The open-circuit voltage is determined by a difference between the energy potential of the dye and the redox potential of the electrolyte.

The electrolyte solution may be uniformly dispersed between the first and second electrodes, or it may smear into the light absorption layer.

The electrolyte solution may be any substance with hole conductivity. For example, the electrolyte may be prepared by dissolving iodine in acetonitrile, but the electrolyte is not limited to iodine acetonitrile solutions.

The dye-sensitized solar cell having the above-described structure can be prepared by forming a first electrode with a conductive transparent substrate, forming a light absorption layer including a semiconductor particulate and a dye on a first side of the first electrode, forming a second electrode facing the first electrode and the light absorption layer, filling an electrolyte between the first electrode and the second electrode, and sealing the cell.

The preparation of photovoltaic cells having the above-described structure is widely known. In the present specification, therefore, only the formation of the light absorption layer, will be described.

First, a conductive transparent substrate for a first electrode is provided. A first side of the conductive transparent substrate is coated with a paste including a semiconductor particulate, and the paste is heat treated to form a porous semiconductor particulate layer on the transparent substrate.

The properties of the paste may differ according to how the substrate is coated. Generally, the substrate is coated with the paste by a doctor blade or screen printing method. To form a transparent layer, spin-coating or spraying may be used. Alternatively, a general wet coating method can be used.

When the paste includes a binder, the heat treatment is carried out at a temperature ranging from about 400° C. to about 600° C. for about 30 minutes. When the paste does not include a binder, the heat treatment may be performed at a temperature lower than about 200° C.

The porosity of the porous layer may be increased and maintained when a polymer is added to the porous semiconductor particulate layer and heat treatment is performed at a temperature ranging from about 400° C. to about 600° C. A polymer that does not leave an organic residue after heat treatment should be selected. Nonlimiting examples of suitable polymers include ethylene cellulose (EC), hydroxy propyl cellulose (HPC), polyethylene glycol (PEG), polyethylene oxide (PEO), polyvinyl alcohol (PVA), and polyvinyl pyrrolidone (PVP). The polymer should also be selected that has an appropriate molecular weight considering the coating method and coating conditions. With an appropriate polymer added to the semiconductor particulate layer, dispersion as well as porosity can be improved. Further, the layer can be better formed due to increased viscosity, and adhesiveness to the substrate can be improved.

A dye layer can be formed by spraying a dye dispersion onto the semiconductor particulate layer, or by coating or impregnating the semiconductor particulate layer with, or in, the dye dispersion to adsorb the dye to the semiconductor particulate. The dye dispersion may further include at least one additive for improving the photoelectric efficiency of the solar cell. The additive is as described above and may be selected from compounds represented by Formula 3 above. The additive may be used at a concentration ranging from about 0.3 to about 60 mM in the dye dispersion so that the additive is present in an amount ranging from about 100 to about 3000 parts by weight based on 100 parts by weight of the dye in the light adsorption layer. According to one embodiment, the additive may be used at a concentration ranging from about 5 to about 40 mM. When the amount of the additive is less than about 0.3 mM, dye aggregation may occur. When the amount of the additive is greater than about 60 mM, the dye adsorption amount may be negligible.

The dye is naturally adsorbed to the semiconductor particulate when the first electrode (having the semiconductor particulate layer) is immersed in a dye dispersion for about 12 hours. The dye is the same as described above, and the solvent dispersing the dye is not limited to any specific solvent. Nonlimiting examples of suitable solvents include acetonitrile, dichloromethane, and alcohol-based solvents.

The dye dispersion in which the dye is dispersed may further include an organic pigment of a variety of colors to improve long-wavelength visible ray absorption and to improve dye adsorption efficiency. Nonlimiting examples of suitable organic pigments include cumarine and pheophorbide A (which is a kind of porphyrin).

After the dye layer is formed, a light absorption layer can be prepared by washing out the non-adsorbed dye through solvent washing.

The second electrode is prepared by forming a conductive layer including a conductive substance on a conductive transparent substrate by electroplating, or physical vapor deposition (PVD), such as sputtering or electron beam deposition.

The first electrode and the second electrode are disposed such that the light absorption layer faces the second electrode. Then, the space between the light absorption layer and the second electrode is filled with the electrolyte and sealed to fabricate a dye-sensitized solar cell.

The first electrode and the second electrode are joined together using an adhesive agent. The adhesive agent may be a thermoplastic polymer film, such as Surlyn produced by the DuPont Company. The thermoplastic polymer film is placed between the two electrodes, and heat and pressure are applied to the electrodes. An epoxy resin or an ultraviolet (UV) ray initiator may be used as the adhesive agent. The adhesive may harden after heat treatment or UV treatment.

The following examples are presented for illustrative purposes only, and do not limit the scope of the invention.

PREPARATION EXAMPLE 1

Preparation of Dye (E)-3-(5-((5-(4-(bis(9,9-dimethyl-9H-fluoren-2-yl) amino)phenyl)thiophene-2-yl)dimethylsilyl)thiophene-2-yl)-2-cyanoacetic acid was prepared according the following Reaction Scheme 1.

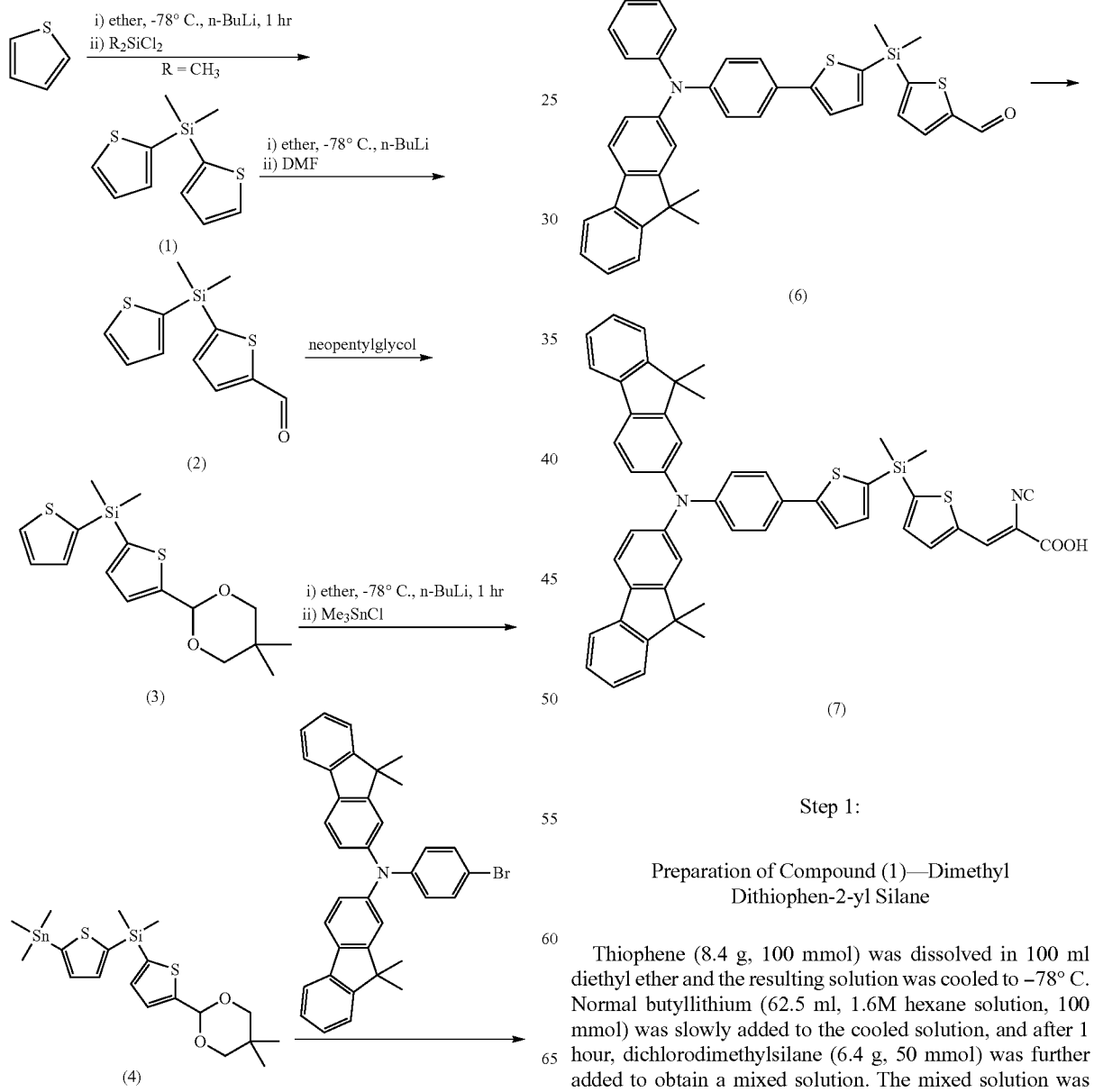

Step 1:

Preparation of Compound (1)—Dimethyl Dithiophen-2-yl Silane

Thiophene (8.4 g, 100 mmol) was dissolved in 100 ml diethyl ether and the resulting solution was cooled to −78° C. Normal butyllithium (62.5 ml, 1.6M hexane solution, 100 mmol) was slowly added to the cooled solution, and after 1 hour, dichlorodimethylsilane (6.4 g, 50 mmol) was further added to obtain a mixed solution. The mixed solution was agitated for 4 hours at room temperature and then extracted with water and diethyl ether. Chromatography (eluent: hexane) was performed on the resulting extract to obtain Compound (1) (yield: 65%).

Step 2:

Preparation of Compound (2)—5-(dimethyl (thiophen-2-yl)silyl)thiophene-2-cabaldehyde The dimethyl dithiophen-2-yl silane (10 g, 40 mmol) prepared in Step 1 was dissolved in diethyl ether (100 ml), and the resulting solution was cooled to −78° C. Normal butyllithium (25 ml, 1.6M hexane solution, 40 mmol) was slowly added to the cooled solution, and then after 1 hour, dimethyl formamide (3.6 g, 50 mmol) was further added to obtain a mixed solution. The mixed solution was agitated for 4 hours at room temperature and then extracted with water and diethyl ether. Chromatography (eluent: dichloromethane:hexane=3:1) was performed on the resulting extract to obtain Compound (2) (yield: 82%).

Step 3:

Preparation of Compound (3)—(5-(5,5-dimethyl-1,3-dioxan-2-yl)thiophen-2-yl)dimethyl(thiophen-2-yl) silane 5-(dimethyl(thiophen-2-yl)silyl)thiophene-2-cabaldehyde (3.38 g, 10 mmol) prepared in Step 2 was mixed with neopentylglycol (1.25 g, 12 mmol) and p-toluenesulfonic acid (0.02 g). The resulting mixture was dissolved in benzene (50 ml) and agitated while refluxing for 3 hours to prepare a mixed solution. The mixed solution was extracted using sodium bicarbonate (5% w/v, 50 ml) to separate the organic layer. The organic layer was dried, and chromatography (eluent: dichloromethane:hexane=3:1) was performed to obtain compound (3) (yield: 85%).

Step 4:

Preparation of Compound (4)—(5-(5,5-dimethyl-1,3-dioxan-2-yl)thiophen-2-yl)dimethyl (5-(trimethylstannyl)thiophen-2-yl)silane The Compound (3) (0.50 g, 1 mmol) prepared in Step 3 was dissolved in 25 ml diethylether, and the resulting solution was cooled to −78° C. Normal butyllithium (0.62 ml, 1.6M hexane solution, 1 mmol) was slowly added to the cooled solution, and then after 1 hour, trimethylchlorostannane (1 ml, 1.0M in a tetrahydrofuran solution, 1 mmol) was further added to obtain a mixed solution. The mixed solution was agitated for 4 hours at room temperature and then extracted with diethyl ether. The resulting extract was dried to obtain Compound (4) (yield: 76%).

Step 5:

Preparation of Compound (5)—N-(4-(5-((5-(5,5-dimethyl-1,3-dioxan-2-yl)thiophen-2-yl)dimethylsilyl)thiophen-2-yl)phenyl)-N-(9,9-dimethyl-9H-fluoren-2-yl)-9,9-dimethyl-9H-fluorene-2-amine (5)

The Compound (4) (0.50 g, 1 mmol) prepared in the Step 4 was dissolved in toluene (25 ml) along with N-(4-bromophenyl)-N-(9,9-dimethyl-9H-fluoren-2-yl)-9,9-dimethyl-9H-fluorene-2-amine (0.55 g, 1 mmol) and Pd(PPh$_3$)$_4$ (33 mg, 0.03 mmol). The mixture was agitated while refluxing to prepare a mixed solution. After 12 hours, the mixed solution was cooled to room temperature, and the organic materials were extracted using water and a small amount of toluene. The extracted organic materials were separated and dried, and then chromatography (eluent: dichloromethane:hexane=2:1) was performed to obtain pure Compound (5) (yield: 63%).

Step 6:

Preparation of Compound (6)—5-((5-(4-(bis (9,9-dimethyl-9H-fluoren-2-yl)amino)phenyl)thiophen-2-yl)dimethylsilyl)thiophene-2-cabaldehyde The compound (5) (0.51 g, 0.7 mmol) prepared in Step 5 was added to a mixture of tetrahydrofuran (20 ml), trifluoroacetic acid (2 ml), and water (3 ml), and then agitated at room temperature for 3 hours or more to prepare a mixed solution. The mixed solution was extracted using water and diethylether, and then dried. Chromatography (eluent: dichloromethane:hexane=2:1) was performed on the dried extract to separate pure Compound (6) (yield: 81%).

Step 7:

Preparation of Compound (7)—(E)-3-(5-((5-(4-(bis (9,9-dimethyl-9H-fluoren-2-yl)amino)phenyl) thiophen-2-yl)dimethylsilyl)thiophen-2-yl)-2-cyanoacetic acid The Compound (6) (0.15 g, 0.2 mmol) prepared in Step 6 was mixed with cyanoacetic acid (34 mg, 0.4 mmol) (6), piperidine (18 μg, 0.2 mmol), chloroform (30 ml), and acetonitrile (10 ml). The resulting mixed solution was heated for 12 hours to remove the solvents. The resulting product was dissolved in dichloromethane, and then washed with water to extract the dichloromethane organic solvent and dried. Chromatography (eluent: dichloromethane:methanol=9:1) was performed on the dried product to separate pure Compound (7) (yield: 57%).

EXAMPLE 1

Fabrication of Dye-Sensitized Solar Cell

A titanium oxide dispersion including titanium oxide particles with a particle diameter ranging from 5 to 15 nm was applied to a 1 cm$^2$ indium-doped tin oxide transparent conductor using a doctor blade, and heat treatment was performed at 450° C. for 30 minutes to form an 18 μm-thick porous titanium oxide layer. The 18 μm-thick porous titanium oxide layer was maintained at 80° C. and immersed in a 0.3 mM dye dispersion (which was prepared by dissolving the Compound (7) (represented by Chemical Formula 2 below) prepared according to Preparation Example 1 in ethanol) to prepare a 0.3 mM dye dispersion. Deoxycholic acid was added to the dye dispersion at a 10 mM concentration, and the titanium oxide layer adsorbed the dye for over 12 hours. The dye-adsorbed porous titanium oxide layer was washed with ethanol and dried at room temperature to form a first electrode with a light absorption layer.

A second electrode was prepared by depositing a 200 nm-thick Pt layer on an indium-doped tin oxide transparent conductor by sputtering. A fine hole (for injecting electrolyte solution) was formed using a drill having a diameter of 0.75 mm.

A 60 μm-thick thermoplastic polymer film was disposed between the first electrode and the second electrode, and pressure was applied to the first and second electrodes at 100° C. for 9 seconds to adhere the two electrodes. An oxidation-reduction electrolyte was injected through the fine hole formed in the second electrode, and the fine hole was sealed using a glass cover and a thermoplastic polymer film to thereby fabricate a dye-sensitized solar cell. The oxidation-reduction electrolyte was prepared by dissolving 0.62M 1,2-dimethyl-3-hexylimidazolium iodide, 0.5M 2-aminopyrimidine, 0.1M LiI, and 0.05M I₂ in an acetonitrile solvent.

Chemical Formula 2

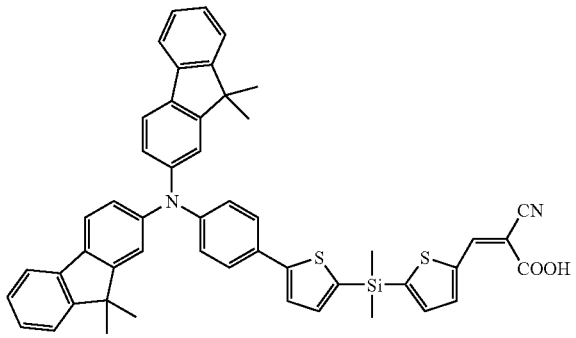

EXAMPLE 2

Fabrication of Dye-Sensitized Solar Cell

A dye-sensitized solar cell was fabricated as in Example 1, except that deoxycholic acid was not added to the dye dispersion.

COMPARATIVE EXAMPLE 1

Fabrication of Dye-Sensitized Solar Cell

A titanium oxide dispersion including titanium oxide particles with a particle diameter ranging from 5 to 15 nm was applied to a 1 cm² indium-doped tin oxide transparent conductor using a doctor blade, and heat treatment was performed at 450° C. for 30 minutes to form an 18 μm-thick porous titanium oxide layer. The 18 μm-thick porous titanium oxide layer was maintained at 80° C. and immersed in a 0.3 mM dye dispersion solution (which was prepared by dissolving the compound represented by the following Formula 5 (described in Arakawa, et al., Japan AIST, NKX-2553, Chem. Commun. 2003, 252, the entire content of which is incorporated herein by reference) in ethanol). The porous titanium oxide layer adsorbed the dye for over 12 hours. The dye-adsorbed porous titanium oxide layer was washed with ethanol and dried at room temperature to thereby form a first electrode with a light absorption layer.

A second electrode was prepared by depositing a 200 nm-thick Pt layer on an indium-doped tin oxide transparent conductor by sputtering. A fine hole (for injecting electrolyte solution) was formed using a drill having a diameter of 0.75 mm.

A 60 μm-thick thermoplastic polymer film was disposed between the first electrode and the second electrode, and pressure was applied to the first and second electrodes at 100° C. for 9 seconds to adhere the two electrodes. An oxidation-reduction electrolyte was injected through the fine hole in the second electrode, and the fine hole was sealed using a glass cover and thermoplastic polymer film to thereby fabricate a dye-sensitized solar cell. The oxidation-reduction electrolyte was prepared by dissolving 0.62M 1,2-dimethyl-3-hexylimidazolium iodide, 0.5M 2-aminopyrimidine, 0.1M LiI, and 0.05M I₂ in an acetonitrile solvent.

Chemical Formula 5

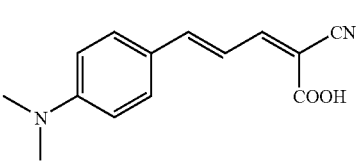

COMPARATIVE EXAMPLE 2

Fabrication of Dye-Sensitized Solar Cell

A dye-sensitized solar cell was fabricated as in Comparative Example 1, except that the compound represented by Formula 6 below (described in Arakawa, et al., Japan AIST, NKX-2593, New. J. Chem. 2003, 27, 783, the entire content of which is incorporated herein by reference) was used as the dye.

Chemical Formula 6

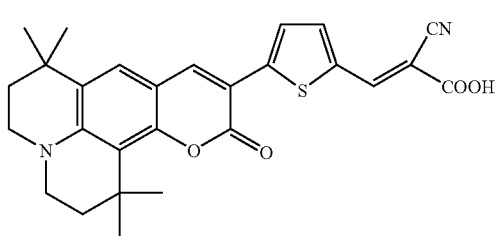

COMPARATIVE EXAMPLE 3

Fabrication of Dye-Sensitized Solar Cell

A dye-sensitized solar cell was fabricated as in Comparative Example 1, except that the compound represented by Formula 7 below (described in Arakawa, et al., Japan AIST, NKX-2593, New. J. Chem. 2003, 27, 783, the entire content of which is incorporated herein by reference) was used as the dye.

Chemical Formula 7

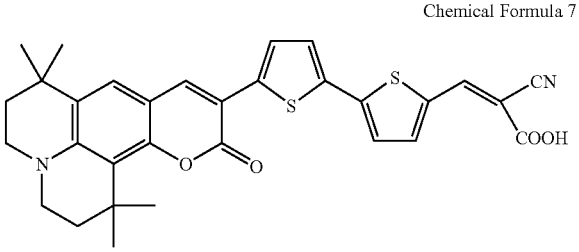

COMPARATIVE EXAMPLE 4

Fabrication of Dye-Sensitized Solar Cell

A dye-sensitized solar cell was fabricated as in Comparative Example 3, except that deoxycholic acid was further added to the dye dispersion at a 40 mM concentration.

Photocurrent voltages of the dye-sensitized solar cells according to Examples 1 and 2 and Comparative Examples 1 to 4 were measured, and the open-circuit voltage (Voc), current density (short-circuit current: Jsc), and fill factor (FF) were calculated based on a curved line of the measured photocurrent voltages. From the results, solar cell efficiency was evaluated.

Herein, a xenon lamp (Oriel, 01193) was used as a light source, and the solar condition (AM 1.5) of the xenon lamp was corrected using a standard solar cell (Frunhofer Institute Solare Engeriessysteme, Certificate No. C-ISE369, Type of material: Mono-Si+KG filter). The measurement results are shown in the following Table 1.

The fill factor is a value obtained by dividing Vmp×Jmp by Voc×Jsc, where Vmp is the current density and Jmp is the voltage at the maximum electric power voltage. The photovoltaic efficiency (η) of a solar cell is a conversion efficiency of solar energy to electrical energy, which can be obtained by dividing the solar cell electrical energy (current×voltage×fill factor) by energy per unit area ($P_{inc}$) as shown in the following Equation 1.

$$\eta = (Voc \cdot Jsc \cdot FF)/(P_{inc})$$  Equation 1

In Equation 1, $P_{inc}$ is 100 mW/cm² (1 sun).

TABLE 1

|  | Example 1 | Example 2 | Comparative Example 1 | Comparative Example 2 | Comparative Example 3 | Comparative Example 4 |
|---|---|---|---|---|---|---|
| Open-circuit voltage (V) | 0.76 | 0.67 | 0.53 | 0.55 | 0.56 | 0.57 |
| Current density (mA/cm²) | 13.45 | 12.12 | 4.57 | 7.35 | 9.07 | 10.61 |
| Fill Factor | 68 | 69 | 53 | 64 | 58 | 65 |
| Efficiency (%) | 6.88 | 5.60 | 1.29 | 2.61 | 2.91 | 3.93 |

As shown in Table 1, the open-circuit voltages (Voc) of the solar cells according to Examples 1 and 2 were 0.76 and 0.67V, respectively, whereas those of the solar cells according to Comparative Examples 1 to 4 were less than 0.6V. The current densities and fill factors of the dye-sensitized solar cells according to Examples 1 and 2 were higher than those of Comparative Examples 1 to 4, indicating that the dye-sensitized solar cells according to Examples 1 and 2 have remarkably better photoelectric efficiency than those of Comparative Examples 1 to 4. From these results, it is confirmed that the dyes included in the dye-sensitized solar cells according to Examples 1 and 2 show better efficiency than the dyes used in the solar cells according to Comparative Examples 1 to 4.

Figure 2:
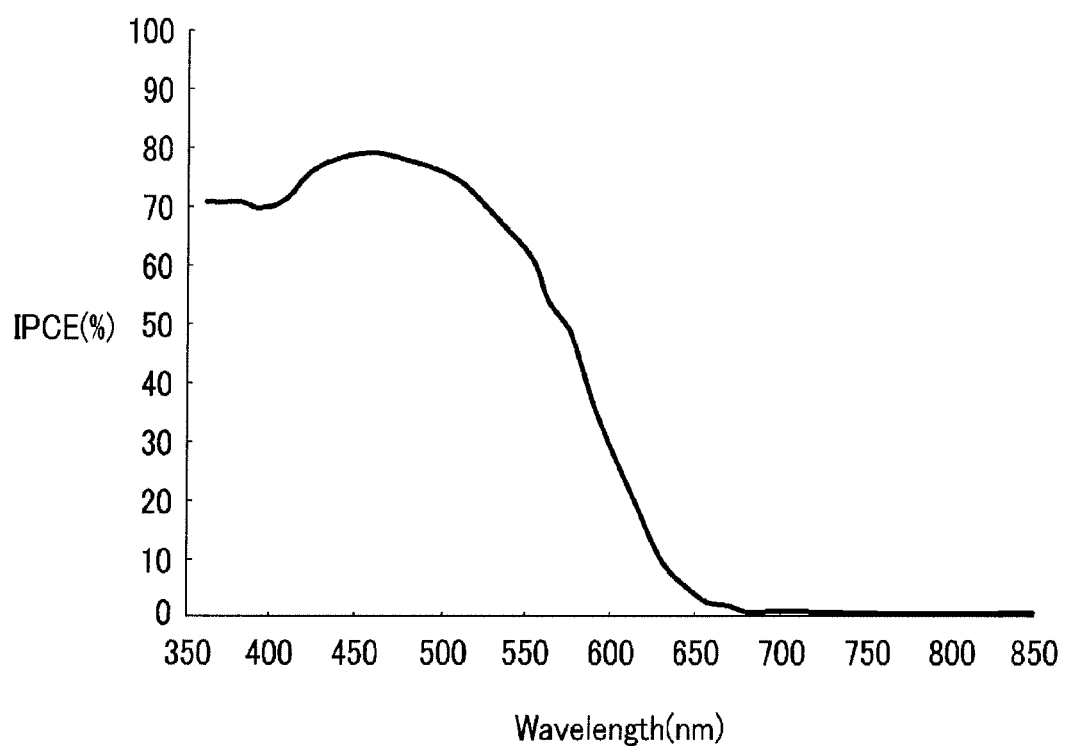
FIG. 2 is a graph of the incident photon-to-current efficiency (IPCE) according to wavelength of the dye-sensitized solar cell prepared according to Example 1.

FIG. 2 is a graph of the incident photon-to-current efficiency (IPCE) of the solar cell according to Example 1. As shown in FIG. 2, the solar cell including both the silane-containing organic dye and the additive according to Example 1 has good photon-to-current efficiency. This result is due to the silane-containing organic dye itself having good photon-to-current efficiency, and the adsorption of the silane-containing organic dye and deoxycholic acid together on $TiO_2$, thereby increasing photon-to-current efficiency.

While the present invention has been illustrated and described in connection with certain exemplary embodiments, it is understood by those of ordinary skill in the art that various modifications and changes to the described embodiments may be made without spirit and scope of the present invention, as defined in the following claims.

What is claimed is:

1. A dye for a dye-sensitized solar cell comprising a compound represented by Chemical Formula 1-A:

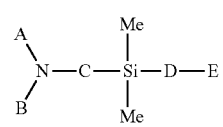

Chemical Formula 1-A wherein:
A and B are independently a substituted or unsubstituted aromatic hydrocarbon, a substituted or unsubstituted heterocycle, or a combination thereof,
C is a substituent represented by Chemical Formula 1-1,

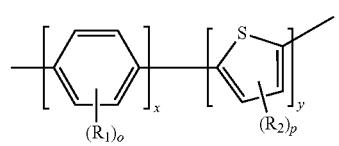

Chemical Formula 1-1

D is a substituent represented by Chemical Formula 1-2,

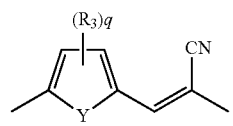

Chemical Formula 1-2 wherein:
each of $R_1$, $R_2$, and $R_3$ is independently a hydrogen atom, a hydroxy group, a halogen, a nitro group, a cyano group, an amino group, an acyl group, an acyloxy group, an acylamino group, a carboxyl group, a sulfonyl group, an alkyl group, a cycloalkyl group, a haloalkyl group, an alkylamino group, an alkylsulfonyl group, an alkylthio group, an aminosulfonyl group, an alkoxy group, an alkoxysulfonyl group, an alkoxycarbonyl group, an aryl group, an aryloxy group, an aryloxycarbonyl group, an alkenyl group, an alkynyl group, an aralkyl group, or a heterocyclic group,
o is an integer ranging from 0 to 6,
p is an integer ranging from 0 to 3,
q is 0 or 1, each of x and y is independently 1 or 2,
Y is O, S, or NR', wherein R' is hydrogen or an alkyl group, and
E is COOH.

2. The dye of claim 1, wherein A and B are independently:
a substituted or unsubstituted C6 to C20 aromatic hydrocarbon,
a substituted or unsubstituted heterocycle comprising oxygen, sulfur, nitrogen, or a combination thereof, or
a combination thereof.

3. The dye of claim 1, wherein at least one of A and B is a fluorenyl group.

4. The dye of claim 1, wherein A and B independently comprise a substituent including a hydrogen atom, a hydroxy group, a halogen, a nitro group, a cyano group, an amino group, an acyl group, an acyloxy group, an acylamino group, a carboxyl group, a sulfonyl group, an alkyl group, a cycloalkyl group, a haloalkyl group, an alkylamino group, an alkylsulfonyl group, an alkylthio group, an aminosulfonyl group, an alkoxy group, an alkoxysulfonyl group, an alkoxycarbonyl group, an aryl group, an aryloxy group, an aryloxycarbonyl group, an alkenyl group, an alkynyl group, an aralkyl group, or a heterocyclic group.

5. The dye of claim 1, wherein A and B are independently a substituted or unsubstituted aromatic hydrocarbon, a substituted or unsubstituted heterocycle, or a combination thereof, wherein at least one of A and B is a fluorenyl group.

6. The dye of claim 1, wherein the dye is a compound represented by Chemical Formula 2:

Chemical Formula 2

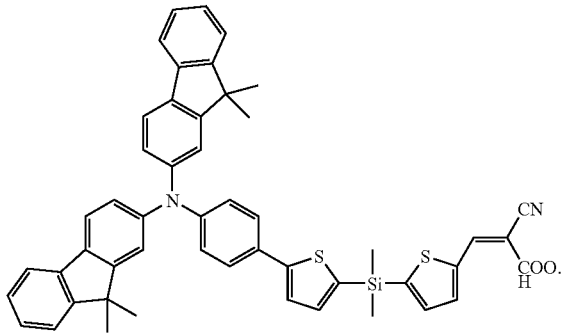

7. A dye-sensitized solar cell comprising:
a first electrode;
a light absorption layer on the first electrode;
a second electrode facing the light absorption layer on the first electrode; and
an electrolyte between the first electrode and the second electrode,
wherein the light absorption layer comprises a semiconductor particulate and a dye, wherein the dye comprises a compound represented by Chemical Formula 1-A:

Chemical Formula 1-A

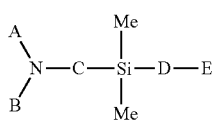

wherein:
A and B are independently a substituted or unsubstituted aromatic hydrocarbon, a substituted or unsubstituted heterocycle, or a combination thereof,
C is a substituent represented by Chemical Formula 1-1, Chemical Formula 1-1

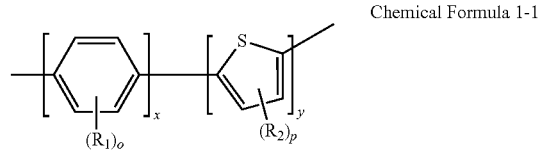

D is a substituent represented by Chemical Formula 1-2,

Chemical Formula 1-2

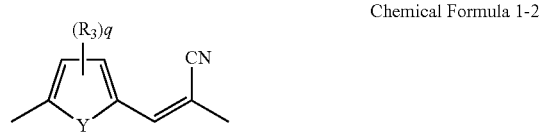

wherein:
each of $R_1$, $R_2$, and $R_3$ is independently a hydrogen atom, a hydroxy group, a halogen, a nitro group, a cyano group, an amino group, an acyl group, an acyloxy group, an acylamino group, a carboxyl group, a sulfonyl group, an alkyl group, a cycloalkyl group, a haloalkyl group, an alkylamino group, an alkylsulfonyl group, an alkylthio group, an aminosulfonyl group, an alkoxy group, an alkoxysulfonyl group, an alkoxycarbonyl group, an aryl group, an aryloxy group, an aryloxycarbonyl group, an alkenyl group, an alkynyl group, an aralkyl group, or a heterocyclic group,
o is an integer ranging from 0 to 6,
p is an integer ranging from 0 to 3,
q is 0 or 1,
each of x and y is independently 1 or 2,
Y is O, S, or NR', wherein R' is hydrogen or an alkyl group, and
E is COOH.

8. The dye-sensitized solar cell of claim 7, wherein
A and B are independently:
a substituted or unsubstituted C6 to C20 aromatic hydrocarbon,
a substituted or unsubstituted heterocycle comprising oxygen, sulfur, nitrogen, or a combination thereof, or
a combination thereof.

9. The dye-sensitized solar cell of claim 7, wherein at least one of A and B is a fluorenyl group.

10. The dye-sensitized solar cell of claim 7, wherein A and B comprise a substituent including a hydrogen atom, a hydroxy group, a halogen, a nitro group, a cyano group, an amino group, an acyl groups, an acyloxy group, an acylamino group, a carboxyl group, a sulfonyl group, an alkyl group, a cycloalkyl group, a haloalkyl group, an alkylamino group, an alkylsulfonyl group, an alkylthio group, an aminosulfonyl group, an alkoxy group, an alkoxysulfonyl group, an alkoxycarbonyl group, an aryl group, an aryloxy group, an aryloxycarbonyl group, an alkenyl group, an alkynyl group, an aralkyl group, or a heterocyclic group.

11. The dye-sensitized solar cell of claim 7, wherein A and B are independently a substituted or unsubstituted aromatic hydrocarbon, a substituted or unsubstituted heterocycle, or a combination thereof, wherein at least one of A and B is a fluorenyl group.

12. The dye-sensitized solar cell of claim 7, wherein the dye comprises a compound represented by the following Formula 2:

Chemical Formula 2

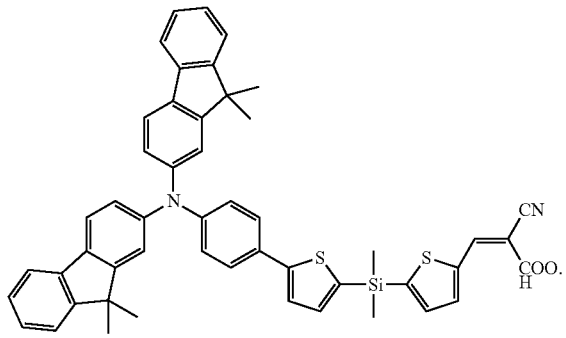

13. The dye-sensitized solar cell of claim 7, wherein the light absorption layer further comprises an additive including compounds represented by Chemical Formula 3:

Chemical Formula 3

$$Z-CO_2H$$

wherein Z is an alkyl group, a cycloalkyl group, a haloalkyl group, an alkylsulfonyl group, an alkylthio group, an alkoxy group, an alkoxysulfonyl group, an alkoxycarbonyl group, an aryl group, an aryloxy group, an alkenyl group, an aralkyl group, or a heterocyclic group.

14. The dye-sensitized solar cell of claim 13, wherein the additive is deoxycholic acid.

15. The dye-sensitized solar cell of claim 13, wherein the additive is present in an amount ranging from about 100 to about 3000 parts by weight based on 100 parts by weight of the dye.

16. The dye-sensitized solar cell of claim 7, wherein the light absorption layer has a thickness of about 25 μm or less.

* * * * *

UNITED STATES PATENT AND TRADEMARK OFFICE
CERTIFICATE OF CORRECTION

| | | |
|---|---|---|
| PATENT NO. | : 7,989,691 B2 | Page 1 of 1 |
| APPLICATION NO. | : 12/324962 | |
| DATED | : August 2, 2011 | |
| INVENTOR(S) | : Soo-Jin Moon et al. | |

It is certified that error appears in the above-identified patent and that said Letters Patent is hereby corrected as shown below:

In the Claims

Column 22, Claim 10, line 55.

Delete "groups"
Insert -- group --

Signed and Sealed this
First Day of May, 2012

David J. Kappos
*Director of the United States Patent and Trademark Office*